US008400567B2

(12) United States Patent
Lee et al.

(10) Patent No.: US 8,400,567 B2
(45) Date of Patent: Mar. 19, 2013

(54) METHOD FOR RECOVERING PIXEL CLOCKS BASED ON INTERNAL DISPLAY PORT INTERFACE AND DISPLAY DEVICE USING THE SAME

(75) Inventors: Chongho Lee, Paju-si (KR); Sunghoon Kim, Paju-si (KR); Sungwon Kim, Yongin-si (KR); Dongwon Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 13/157,950

(22) Filed: Jun. 10, 2011

(65) Prior Publication Data

US 2011/0310296 A1 Dec. 22, 2011

(30) Foreign Application Priority Data

Jun. 18, 2010 (KR) ........................ 10-2010-0057926

(51) Int. Cl.
*H03L 7/00* (2006.01)

(52) U.S. Cl. ......... 348/537; 348/539; 348/540; 348/547

(58) Field of Classification Search .................. 348/539, 348/537, 540, 547, 550, 739, 790–793, 800–803; *H04N 5/04, 9/12, 9/30, 3/14, 5/70; H03L 7/00*
See application file for complete search history.

(56) References Cited

U.S. PATENT DOCUMENTS

2011/0145877 A1* 6/2011 Kobayashi .................... 725/115

* cited by examiner

*Primary Examiner* — Sherrie Hsia
(74) *Attorney, Agent, or Firm* — Birch, Stewart, Kolasch & Birch, LLP

(57) ABSTRACT

A method for recovering pixel clocks based on an iDP interface includes selecting a prime factor closest to VA or HA from prime factors of X, and selecting a value obtained by subtracting VA from the selected prime factor, as VB, in $$Mvid = \frac{(HA + HB) \times (VA + VB)}{X},$$

where HA indicates a horizontal active period, HB indicates a horizontal blank interval, VA indicates a vertical active period, and VB indicates a vertical blank interval, fixing the selected VB value, and selecting a total of HB within one frame period and the number of lanes under a condition that Mvid has an integer value, and recovering pixel clocks by multiplying a frequency of link symbol clocks of data received via the lanes by a multiplication of Mvid/48.

14 Claims, 21 Drawing Sheets

FIG. 7

| PRIME FACTOR OF 56250 | |
|---|---|
| 1 | 250 |
| 2 | 375 |
| 3 | 450 |
| 5 | 625 |
| 6 | 750 |
| 9 | 1125 |
| 10 | 1250 |
| 15 | 1875 |
| 18 | 2250 |
| 25 | 3125 |
| 30 | 3750 |
| 45 | 5625 |
| 50 | 6250 |
| 75 | 9375 |
| 90 | 11250 |
| 125 | 18750 |
| 150 | 28125 |
| 225 | 56250 |

FIG. 8

| Cinema (2560x1080) @ 120Hz | | | | | | | | | | |
|---|---|---|---|---|---|---|---|---|---|---|
| HB Total | HB' (4 Lane) | HB' (5 Lane) | HB' (6 Lane) | HB' (7 Lane) | VB | Pixel Clock (MHz) | # iDP Lane (24bpp) | # iDP Lane (30bpp) | # iDP Lane (36bpp) | Mvid |
| 40 | 10.00 | 8.00 | 6.66 | NA | 45 | 351.00 | 3.25 | 4.06 | 4.88 | 52 |
| 90 | 22.50 | 18.00 | 15.00 | NA | 45 | 357.75 | 3.31 | 4.14 | 4.97 | 53 |
| 140 | 35.00 | 28.00 | 23.33 | NA | 45 | 364.50 | 3.38 | 4.22 | 5.06 | 54 |
| 190 | 47.50 | 38.00 | 31.66 | NA | 45 | 371.25 | 3.44 | 4.30 | 5.16 | 55 |
| 240 | 60.00 | 48.00 | 40.00 | NA | 45 | 378.00 | 3.50 | 4.38 | 5.25 | 56 |
| 290 | 72.50 | 58.00 | 48.33 | NA | 45 | 384.75 | 3.56 | 4.45 | 5.34 | 57 |
| 340 | 85.00 | 68.00 | 56.66 | NA | 45 | 391.50 | 3.63 | 4.53 | 5.44 | 58 |
| 390 | 97.50 | 78.00 | 65.00 | NA | 45 | 398.25 | 3.69 | 4.61 | 5.53 | 59 |
| 440 | 110.00 | 88.00 | 73.33 | NA | 45 | 405.00 | 3.75 | 4.69 | 5.63 | 60 |
| 490 | 122.50 | 98.00 | 81.66 | NA | 45 | 411.75 | 3.81 | 4.77 | 5.72 | 61 |
| 540 | 135.00 | 108.00 | 90.00 | NA | 45 | 418.50 | 3.88 | 4.84 | 5.81 | 62 |
| 590 | 147.50 | 118.0 | 98.33 | NA | 45 | 425.25 | 3.94 | 4.92 | 5.91 | 63 |
| 640 | 160.50 | 128.00 | 106.66 | NA | 45 | 432.00 | 4.00 | 5.00 | 6.00 | 64 |
| 690 | NA | 138.00 | 115.00 | 98.57 | 45 | 438.75 | 4.06 | 5.08 | 6.09 | 65 |
| 740 | NA | 148.00 | 123.33 | 105.71 | 45 | 445.50 | 4.13 | 5.16 | 6.19 | 66 |

FIG. 9

| PRIME FACTOR OF 112500 | |
|---|---|
| 1 | 112500 |
| 2 | 56250 |
| 3 | 37500 |
| 4 | 28125 |
| 5 | 22500 |
| 6 | 18750 |
| 9 | 12500 |
| 10 | 11250 |
| 12 | 9375 |
| 15 | 7500 |
| 18 | 6250 |
| 20 | 5625 |
| 25 | 4500 |
| 30 | 3750 |
| 36 | 3125 |
| 45 | 2500 |
| 50 | 2250 |
| 60 | 1875 |
| 75 | 1500 |
| 90 | 1250 |
| 125 | 900 |
| 150 | 750 |
| 180 | 625 |
| 225 | 500 |
| 250 | 450 |
| 300 | 375 |
| 375 | 300 |

FIG. 10

| PRIME FACTOR OF 28125 | |
|---|---|
| 1 | 28125 |
| 3 | 9375 |
| 5 | 5625 |
| 9 | 3125 |
| 15 | 1875 |
| 25 | 1125 |
| 45 | 625 |
| 75 | 375 |
| 125 | 225 |

FIG. 11

HB Increment = 90

| Resolution | Refresh Rate (Hz) | H_Active | V_Active | H_Blank | V_Blank | H_Total | V_Total | Pix_Clk (MHz) | iDP_Lane 24bpp | iDP_Lane 30bpp | iDP_Lane 36bpp | Mvid |
|---|---|---|---|---|---|---|---|---|---|---|---|---|
| FHD | 60 | 1920 | 1080 | 10 | 170 | 1930 | 1250 | 144.75000 | 1.34 | 1.68 | 2.01 | 21.4444444444 |
| FHD | 60 | 1920 | 1080 | 60 | 170 | 1980 | 1250 | 148.50000 | 1.38 | 1.72 | 2.06 | 22.0000000000 |
| FHD | 60 | 1920 | 1080 | 150 | 170 | 2070 | 1250 | 155.25000 | 1.44 | 1.80 | 2.16 | 23.0000000000 |
| FHD | 60 | 1920 | 1080 | 240 | 170 | 2160 | 1250 | 162.00000 | 1.50 | 1.88 | 2.25 | 24.0000000000 |
| FHD | 60 | 1920 | 1080 | 330 | 170 | 2250 | 1250 | 168.75000 | 1.56 | 1.95 | 2.34 | 25.0000000000 |
| FHD | 60 | 1920 | 1080 | 420 | 170 | 2340 | 1250 | 175.50000 | 1.63 | 2.03 | 2.44 | 26.0000000000 |
| FHD | 60 | 1920 | 1080 | 510 | 170 | 2430 | 1250 | 182.25000 | 1.69 | 2.11 | 2.53 | 27.0000000000 |
| FHD | 60 | 1920 | 1080 | 600 | 170 | 2520 | 1250 | 189.00000 | 1.75 | 2.19 | 2.63 | 28.0000000000 |
| FHD | 60 | 1920 | 1080 | 690 | 170 | 2610 | 1250 | 195.75000 | 1.81 | 2.27 | 2.72 | 29.0000000000 |
| FHD | 60 | 1920 | 1080 | 780 | 170 | 2700 | 1250 | 202.50000 | 1.88 | 2.34 | 2.81 | 30.0000000000 |
| FHD | 60 | 1920 | 1080 | 870 | 170 | 2790 | 1250 | 209.25000 | 1.94 | 2.42 | 2.91 | 31.0000000000 |
| FHD | 60 | 1920 | 1080 | 960 | 170 | 2880 | 1250 | 216.00000 | 2.00 | 2.50 | 3.00 | 32.0000000000 |
| FHD | 60 | 1920 | 1080 | 1050 | 170 | 2970 | 1250 | 222.75000 | 2.06 | 2.58 | 3.09 | 33.0000000000 |
| FHD | 60 | 1920 | 1080 | 1140 | 170 | 3060 | 1250 | 229.50000 | 2.13 | 2.66 | 3.19 | 34.0000000000 |
| FHD | 60 | 1920 | 1080 | 1230 | 170 | 3150 | 1250 | 236.25000 | 2.19 | 2.73 | 3.28 | 35.0000000000 |
| FHD | 60 | 1920 | 1080 | 1320 | 170 | 3240 | 1250 | 243.00000 | 2.25 | 2.81 | 3.38 | 36.0000000000 |

FIG. 12

HB Increment = 50

| Resolution | Refresh Rate (Hz) | H_Active | V_Active | H_Blank | V_Blank | H_Total | V_Total | Pix_Clk (MHz) | iDP_Lane 24bpp | iDP_Lane 30bpp | iDP_Lane 36bpp | Mvid |
|---|---|---|---|---|---|---|---|---|---|---|---|---|
| FHD | 120 | 1920 | 1080 | 10 | 45 | 1930 | 1125 | 260.55000 | 2.41 | 3.02 | 3.62 | 38.6000000000 |
| FHD | 120 | 1920 | 1080 | 30 | 45 | 1950 | 1125 | 263.25000 | 2.44 | 3.05 | 3.66 | 39.0000000000 |
| FHD | 120 | 1920 | 1080 | 80 | 45 | 2000 | 1125 | 270.00000 | 2.50 | 3.13 | 3.75 | 40.0000000000 |
| FHD | 120 | 1920 | 1080 | 130 | 45 | 2050 | 1125 | 276.75000 | 2.56 | 3.20 | 3.84 | 41.0000000000 |
| FHD | 120 | 1920 | 1080 | 180 | 45 | 2100 | 1125 | 283.50000 | 2.63 | 3.28 | 3.94 | 42.0000000000 |
| FHD | 120 | 1920 | 1080 | 230 | 45 | 2150 | 1125 | 290.25000 | 2.69 | 3.36 | 4.03 | 43.0000000000 |
| FHD | 120 | 1920 | 1080 | 280 | 45 | 2200 | 1125 | 297.00000 | 2.75 | 3.44 | 4.13 | 44.0000000000 |
| FHD | 120 | 1920 | 1080 | 330 | 45 | 2250 | 1125 | 303.75000 | 2.81 | 3.52 | 4.22 | 45.0000000000 |
| FHD | 120 | 1920 | 1080 | 380 | 45 | 2300 | 1125 | 310.50000 | 2.88 | 3.59 | 4.31 | 46.0000000000 |
| FHD | 120 | 1920 | 1080 | 430 | 45 | 2350 | 1125 | 317.25000 | 2.94 | 3.67 | 4.41 | 47.0000000000 |
| FHD | 120 | 1920 | 1080 | 480 | 45 | 2400 | 1125 | 324.00000 | 3.00 | 3.75 | 4.50 | 48.0000000000 |
| FHD | 120 | 1920 | 1080 | 530 | 45 | 2450 | 1125 | 330.75000 | 3.06 | 3.83 | 4.59 | 49.0000000000 |
| FHD | 120 | 1920 | 1080 | 580 | 45 | 2500 | 1125 | 337.50000 | 3.13 | 3.91 | 4.69 | 50.0000000000 |
| FHD | 120 | 1920 | 1080 | 630 | 45 | 2550 | 1125 | 344.25000 | 3.19 | 3.98 | 4.78 | 51.0000000000 |
| FHD | 120 | 1920 | 1080 | 680 | 45 | 2600 | 1125 | 351.00000 | 3.25 | 4.06 | 4.88 | 52.0000000000 |
| FHD | 120 | 1920 | 1080 | 730 | 45 | 2650 | 1125 | 357.75000 | 3.31 | 4.14 | 4.97 | 53.0000000000 |

FIG. 13

HB Increment = 25

| Resolution | Refresh Rate (Hz) | H_Active | V_Active | H_Blank | V_Blank | H_Total | V_Total | Pix_Clk (MHz) | iDP_Lane 24bpp | iDP_Lane 30bpp | iDP_Lane 36bpp | Mvid |
|---|---|---|---|---|---|---|---|---|---|---|---|---|
| FHD | 240 | 1920 | 1080 | 10 | 45 | 1930 | 1125 | 521.10000 | 4.83 | 6.03 | 7.24 | 77.2000000000 |
| FHD | 240 | 1920 | 1080 | 30 | 45 | 1950 | 1125 | 526.50000 | 4.88 | 6.09 | 7.31 | 78.0000000000 |
| FHD | 240 | 1920 | 1080 | 55 | 45 | 1975 | 1125 | 533.25000 | 4.94 | 6.17 | 7.41 | 79.0000000000 |
| FHD | 240 | 1920 | 1080 | 80 | 45 | 2000 | 1125 | 540.00000 | 5.00 | 6.25 | 7.50 | 80.0000000000 |
| FHD | 240 | 1920 | 1080 | 105 | 45 | 2025 | 1125 | 546.75000 | 5.06 | 6.33 | 7.59 | 81.0000000000 |
| FHD | 240 | 1920 | 1080 | 130 | 45 | 2050 | 1125 | 553.50000 | 5.13 | 6.41 | 7.69 | 82.0000000000 |
| FHD | 240 | 1920 | 1080 | 155 | 45 | 2075 | 1125 | 560.25000 | 5.19 | 6.48 | 7.78 | 83.0000000000 |
| FHD | 240 | 1920 | 1080 | 180 | 45 | 2100 | 1125 | 567.00000 | 5.25 | 6.56 | 7.88 | 84.0000000000 |
| FHD | 240 | 1920 | 1080 | 205 | 45 | 2125 | 1125 | 573.75000 | 5.31 | 6.64 | 7.97 | 85.0000000000 |
| FHD | 240 | 1920 | 1080 | 230 | 45 | 2150 | 1125 | 580.50000 | 5.38 | 6.72 | 8.06 | 86.0000000000 |
| FHD | 240 | 1920 | 1080 | 255 | 45 | 2175 | 1125 | 587.25000 | 5.44 | 6.80 | 8.16 | 87.0000000000 |
| FHD | 240 | 1920 | 1080 | 280 | 45 | 2200 | 1125 | 594.00000 | 5.50 | 6.88 | 8.25 | 88.0000000000 |
| FHD | 240 | 1920 | 1080 | 305 | 45 | 2225 | 1125 | 600.75000 | 5.56 | 6.95 | 8.34 | 89.0000000000 |
| FHD | 240 | 1920 | 1080 | 330 | 45 | 2250 | 1125 | 607.50000 | 5.63 | 7.03 | 8.44 | 90.0000000000 |
| FHD | 240 | 1920 | 1080 | 355 | 45 | 2275 | 1125 | 614.25000 | 5.69 | 7.11 | 8.53 | 91.0000000000 |
| FHD | 240 | 1920 | 1080 | 380 | 45 | 2300 | 1125 | 621.00000 | 5.75 | 7.19 | 8.63 | 92.0000000000 |

FIG. 14

HB Increment = 25

| Resolution | Refresh Rate (Hz) | H_Active | V_Active | H_Blank | V_Blank | H_Total | V_Total | Pix_Clk (MHz) | iDP_Lane 24bpp | iDP_Lane 30bpp | iDP_Lane 36bpp | Mvid |
|---|---|---|---|---|---|---|---|---|---|---|---|---|
| Cinema | 240 | 2560 | 1080 | 10 | 45 | 2570 | 1125 | 693.90000 | 6.43 | 8.03 | 9.64 | 102.8000000000 |
| Cinema | 240 | 2560 | 1080 | 15 | 45 | 2575 | 1125 | 695.25000 | 6.44 | 8.05 | 9.66 | 103.0000000000 |
| Cinema | 240 | 2560 | 1080 | 40 | 45 | 2600 | 1125 | 702.00000 | 6.50 | 8.13 | 9.75 | 104.0000000000 |
| Cinema | 240 | 2560 | 1080 | 65 | 45 | 2625 | 1125 | 708.75000 | 6.56 | 8.20 | 9.84 | 105.0000000000 |
| Cinema | 240 | 2560 | 1080 | 90 | 45 | 2650 | 1125 | 715.50000 | 6.63 | 8.28 | 9.94 | 106.0000000000 |
| Cinema | 240 | 2560 | 1080 | 115 | 45 | 2675 | 1125 | 722.25000 | 6.69 | 8.36 | 10.03 | 107.0000000000 |
| Cinema | 240 | 2560 | 1080 | 140 | 45 | 2700 | 1125 | 729.00000 | 6.75 | 8.44 | 10.13 | 108.0000000000 |
| Cinema | 240 | 2560 | 1080 | 165 | 45 | 2725 | 1125 | 735.75000 | 6.81 | 8.52 | 10.22 | 109.0000000000 |
| Cinema | 240 | 2560 | 1080 | 190 | 45 | 2750 | 1125 | 742.50000 | 6.88 | 8.59 | 10.31 | 110.0000000000 |
| Cinema | 240 | 2560 | 1080 | 215 | 45 | 2775 | 1125 | 749.25000 | 6.94 | 8.67 | 10.41 | 111.0000000000 |
| Cinema | 240 | 2560 | 1080 | 240 | 45 | 2800 | 1125 | 756.00000 | 7.00 | 8.75 | 10.50 | 112.0000000000 |
| Cinema | 240 | 2560 | 1080 | 265 | 45 | 2825 | 1125 | 762.75000 | 7.06 | 8.83 | 10.59 | 113.0000000000 |
| Cinema | 240 | 2560 | 1080 | 290 | 45 | 2850 | 1125 | 769.50000 | 7.13 | 8.91 | 10.69 | 114.0000000000 |
| Cinema | 240 | 2560 | 1080 | 315 | 45 | 2875 | 1125 | 776.25000 | 7.19 | 8.98 | 10.78 | 115.0000000000 |
| Cinema | 240 | 2560 | 1080 | 340 | 45 | 2900 | 1125 | 783.00000 | 7.25 | 9.06 | 10.88 | 116.0000000000 |
| Cinema | 240 | 2560 | 1080 | 365 | 45 | 2925 | 1125 | 789.75000 | 7.31 | 9.14 | 10.97 | 117.0000000000 |

METHOD FOR RECOVERING PIXEL CLOCKS BASED ON INTERNAL DISPLAY PORT INTERFACE AND DISPLAY DEVICE USING THE SAME

This application claims the benefit of Korea Patent Application No. 10-2010-0057926 filed on Jun. 18, 2010, the entire contents of which is incorporated herein by reference for all purposes as if fully set forth herein.

BACKGROUND

1. Field

This document relates to a method for recovering pixel clocks based on an iDP (Internal Display Port) interface and a display device using the same.

2. Related Art

A liquid crystal display has increasingly widened its application range due to the characteristics such as light weight, thin profile, and low power consumption driving. The liquid crystal display is used as a portable computer such as a notebook PC, an office automation device, an audio/video device, an indoor and outdoor advertisement display device, or the like. The liquid crystal display controls electric fields applied to liquid crystal cells so as to modulate light provided from a backlight unit, thereby displaying images.

In order to satisfy needs for high definition display performance from users, the liquid crystal display has increasingly implemented high image quality images at high channel transmission bandwidth and high frame refresh rate for video data. At present, in a television set system, video data transmission between a system on chip ("SoC") generating video data to be displayed on a liquid crystal display panel and a timing controller controlling operation timings of driving circuits of the liquid crystal display panel uses an LVDS (Low Voltage Differential Signaling) interface. The LVDS interface is advantageous in that it has low power consumption and is less influenced by external noise due to use of low voltage swing level and differential signal pair, but is inappropriate for transmission of video data of high resolution due to the limitation of the data transmission rate.

FIG. 1 is a diagram illustrating an example where a SoC board 6 and a panel control board 4 are connected to each other via an LVDS interface in the related art.

Referring to FIG. 1, the four-port LVDS interface, which transmits video data of 30 bpp (bit per pixel) at a frame refresh rate of 120 Hz and a resolution of FHD (Full High-Definition) 1920×1800, connects the SoC board 6 to the panel control board 4 via a two-port connector and cable 8*a* and a two-port connector and cable 8*b* different therefrom. A SoC including an LVDS transmission circuit is mounted on the SoC board 6, and a timing controller 2 including an LVDS reception circuit is mounted on the panel control board 4. The timing controller 2 transmits video data to source drive ICs (Integrated Circuits) via a mini LVDS interface.

Pixel clocks which are necessary to transmit video data of FHD 30 bpp at the frame refresh rate of 120 Hz are transmitted from the SoC to the timing controller 2 in a form of differential signal pairs on the LVDS specification. The frequency of the pixel clocks PXLCLK is given by Equation 1.

$$PXLCLK=(HA+HB)\times(VA+VB)\times f \quad (1)$$

Here, HA represents horizontal active and indicates the number of pixel data to be displayed on one horizontal line of a display panel. HB represents horizontal blank and indicates a value obtained by converting a period where there is no pixel data between neighboring HAs into the number of pixels. VA represents vertical active and indicates the number of pixel data to be displayed on one vertical line of the display panel. VB represents vertical blank and indicates a value obtained by converting a period where there is no pixel data between neighboring VAs into the number of pixels. In addition, f indicates a frame refresh rate.

HB and VB of FHD 120 Hz are respectively 280 and 45 when the frequency of the pixel clocks is 297 MHz. If the frequency of the pixel clocks PXLCLK is calculated using Equation 1, the frequency of the pixel clocks PXLCLK necessary to transmit video data of FHD resolution is 297 MHz. The LVDS interface has a low transmission rate, thus video data is transmitted in parallel using four ports at the rate of 74.25 MHz. A single LVDS port includes six differential signal pairs at 30 bpp, and five pairs are used to transmit video data and the remaining one pair is used to transmit the pixel clocks PXLCLK. The minimum number of pairs required to transmit video data of 30 bpp at the frame refresh rate of 120 Hz is 24, and the number of lines is 48 which is twice thereof. Since the pixel clock dedicated lines exist, four pairs of clock transmission lines are further necessary. Therefore, considering the low transmission rate of the LVDS, the number of lines necessary to transmit video data and pixel clocks increases in geometric progression as the resolution of the display panel becomes high.

A large number of transmission lines applied to the LVDS interface has direct influence on manufacturing costs for display devices, reduces a degree of freedom regarding design of layout of a PCB (Printed Circuit Board), and increases EMI (Electro Magnetic Interference). In addition, EMI on a PCB increases since high frequency clock signals are directly supplied to the PCB. In contrast, the LVDS interface is advantageous in that since the pixel clocks PXLCLK are directly transmitted to a reception circuit Rx from a transmission circuit Tx, the reception circuit Rx need not recover the pixel clocks PXLCLK. Therefore, the LVDS interface can transmit continuous pixel clocks according to all resolutions by applying a defined HB value and a defined VB value without using a data rate throttling ("DRT") function, if video data is transmitted from the transmission circuit Tx at a frequency of desired pixel clocks PXLCLK as shown in Equation 2 and FIG. 2 and the reception circuit Rx is designed to allow the frequency.

$$BW=PXLCLK\times CD \quad (2)$$

Here, BW indicates a channel transmission bandwidth of data, and CD indicates color depth.

The iDP interface, which has been developed as a countermeasure for the existing LVDS interface, supports the serial data link rate of 3.24 Gbps for the lanes, and thus it is possible to transmit video data of high color depth, resolution, and frame refresh rate at a low lane count. The iDP interface does not use clock transmission lines separately in the same manner as the DP interface, and thereby it is necessary for the reception circuit Rx to perform a CDR (Clock and Data Recovery) process for recovering clock signals. For this, the iDP interface recovers the pixel clocks in the reception circuit Rx using a 8-bit M/N PLL (Phase Locked Loop) which multiplies received clocks by M/N. Here, N is set to 48, and M is a positive integer. However, it is difficult to apply the iDP interface since a systematic method for recovering the pixel clocks in the reception circuit Rx is not established.

SUMMARY

Embodiments of this document provide a method for recovering pixel clocks based on an iDP interface, capable of systematically recovering pixel clocks in the iDP interface, and a display device using the same.

According to an embodiment of this document, there is provided a method for recovering pixel clocks based on an iDP interface including selecting a prime factor closest to VA or HA from prime factors of X, and selecting a value obtained by subtracting VA from the selected prime factor, as VB, in $$Mvid = \frac{(HA + HB) \times (VA + VB)}{X},$$

where HA indicates a horizontal active period, HB indicates a horizontal blank interval, VA indicates a vertical active period, and VB indicates a vertical blank interval; fixing the selected VB value, and selecting a total of HB within one frame period and the number of lanes under a condition that Mvid has an integer value; and recovering pixel clocks by multiplying a frequency of link symbol clocks of data received via the lanes by a multiplication of Mvid/48.

According to an embodiment of this document, there is provided a display device including an iDP transmission circuit; an iDP reception circuit configured to recover pixel clocks by multiplying a frequency of main link symbol clocks of data sent from the iDP transmission circuit by a multiplication of Mvid/48; N (where N is a positive integer equal to or more than 2) lanes connected between the iDP transmission circuit and the iDP reception circuit; an SoC (System on Chip) configured to generate the data and transmit the data via the iDP transmission circuit; and a timing controller configured to sample the data received via the iDP reception circuit with the pixel clocks.

The iDP reception circuit selects a prime factor closest to VA or HA from prime factors of X, selects a value obtained by subtracting VA from the selected prime factor, as VB, and selects a total of HB within one frame period and the number of lanes under a condition that Mvid has an integer value in $$Mvid = \frac{(HA + HB) \times (VA + VB)}{X},$$

where HA indicates a horizontal active period, HB indicates a horizontal blank interval, VA indicates a vertical active period, and VB indicates a vertical blank interval; stores VB, the total of HB, information for the number of the lanes, a resolution of the data, and a frame refresh rate; and selects Mvid for recovering the pixel clocks depending on the resolution of the received data, the frame refresh rate, and the number of the lanes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7 is a table illustrating prime factors of 56250;

FIG. 8 is a table illustrating iDP interface parameters at the resolution of 2560×1080 and the frame refresh rate of 120 Hz;

FIG. 9 is a table illustrating prime factors of 112500;

FIG. 10 is a table illustrating prime factors of 28125;

FIG. 11 is a table illustrating iDP interface parameters at the resolution of FHD (1920×1080) and the frame refresh rate of 60 Hz;

FIG. 12 is a table illustrating iDP interface parameters at the resolution of FHD (1920×1080) and the frame refresh rate of 120 Hz;

FIG. 13 is a table illustrating iDP interface parameters at the resolution of FHD (1920×1080) and the frame refresh rate of 240 Hz;

FIG. 14 is a table illustrating iDP interface parameters at the resolution of 2560×1080 and the frame refresh rate of 240 Hz;

DETAILED DESCRIPTION

Figure 1:
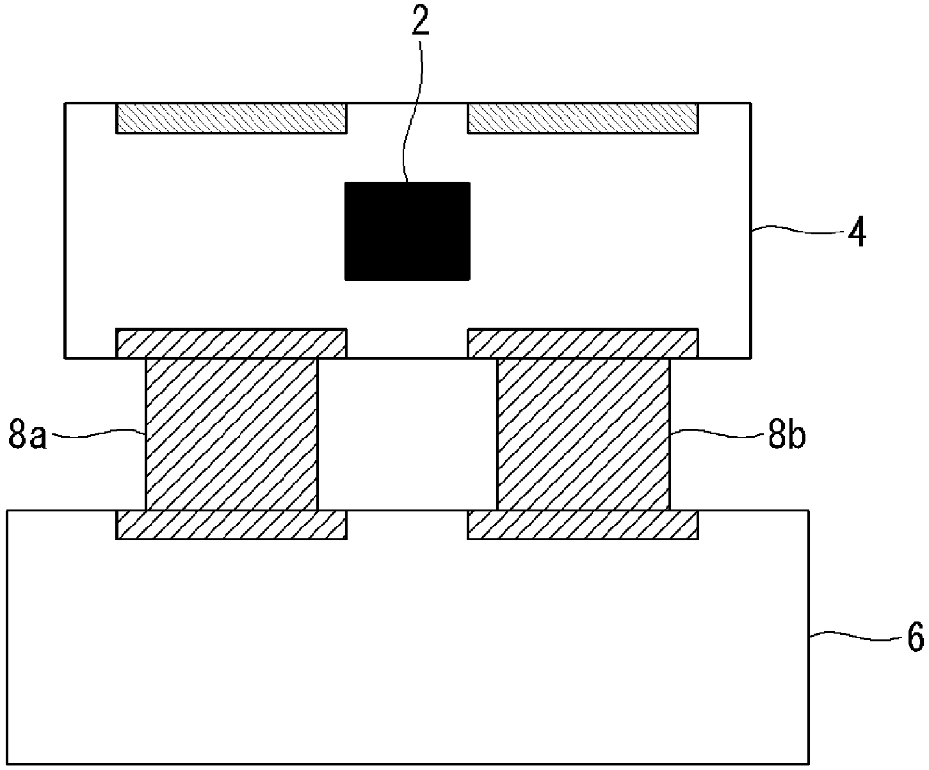
FIG. 1 (RELATED ART)
FIG. 1 is a diagram illustrating an example of LVDS interface connection between an SoC board and a panel control board.
Figure 2:
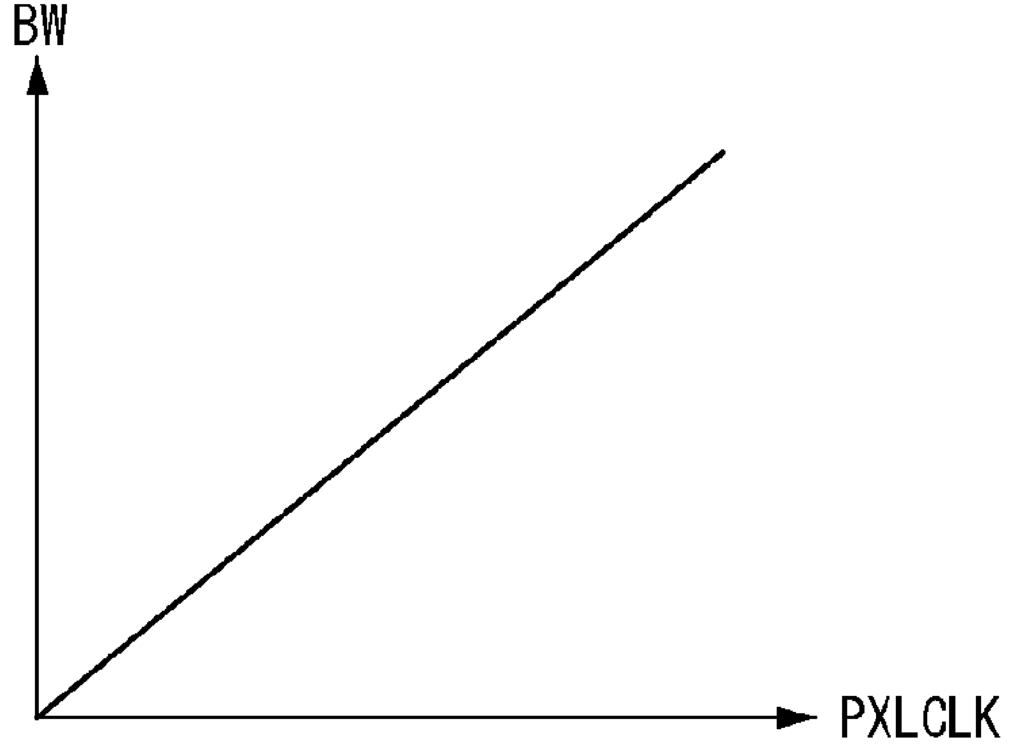
FIG. 2 (RELATED ART)
FIG. 2 is a graph illustrating a relationship between pixel clocks and a data transmission bandwidth in the LVDS interface.

Hereinafter, embodiments of this document will be described in detail with reference to the accompanying drawings. Like reference numerals designate like elements throughout the specification. In the following description, when a detailed description of well-known functions or configurations related to this document is determined to unnecessarily cloud a gist of the present invention, the detailed description thereof will be omitted.

Figure 3:
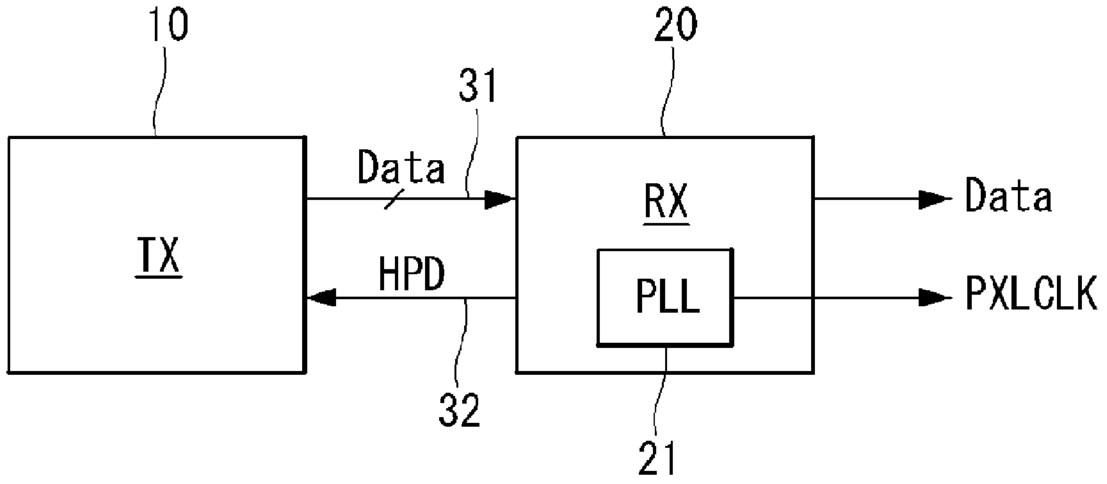
FIG. 3 is a diagram illustrating an iDP transmission circuit and an iDP reception circuit according to an embodiment of this document.

With reference to FIG. 3, an iDP interface includes a plurality of lanes 31 connected between an iDP transmission circuit (TX) 10 and an iDP reception circuit (RX) 20. Each of the lanes 31 includes a pair of lines for transmitting a differential signal pair. Also, the iDP interface includes an HPD (Hot Plug Detect) transmission line 32. The iDP transmission circuit 10 is a source device and detects an HPD signal which is received via the HPD transmission line 32. The iDP transmission circuit 10 transmits main link data, which is encoded by ANSI 8B/10B encoding scheme, via the main link lanes 31 during a period where the HPD signal is maintained to be in a high logic level from a rising edge of the HPD signal. The iDP reception circuit 20 is a sink device, and receives Mvid values sent via the main link lanes 31 and recovers pixel clocks PXLCLK using an M/N PLL 21. In addition, the iDP reception circuit 20 transmits the HPD signal having a low logic level to the iDP transmission circuit 10 in a stand-by mode, and locks the pixel clocks and phases of data symbols output from the M/N PLL 21 in the stand-by mode.

The iDP reception circuit 20 according to an embodiment of this document recovers the pixel clocks PXLCLK based on the following (1) to (8).

(1) Each of the lanes 31 transmits HB corresponding to a value obtained by dividing a total of HB which is obtained by summing HB during one frame period, by a lane count (or the number of lanes $Lane_{count}$). Hereinafter, a horizontal blank interval corresponding to a value obtained by dividing a total of HB by the lane count is referred to as "HB".

(2) HB and VB, which satisfy an integer Mvid value (an M value of M/N PLL) are found by optimizing the DRT function of the iDP standard to all resolutions and frame refresh rate.

(3) HB' is transmitted in a form of an integer or a simple decimal.

(4) Minimum HB' and VB are required to satisfy minimum operation conditions of the iDP reception circuit 20.

(5) In order to obtain the Mvid value as an integer, HA+HB or VA+VB is required to be one of prime factors, 112 or 500, or 56 or 250, or 28 or 125, based on a frame refresh rate.

(6) Fixed HB or VB is required to satisfy Equations 5, 6, 9, and 10.

(7) Maximum HB, which can be transmitted to the maximum at a corresponding link rate, is required to be set in advance in order to prevent many repetitions when HB is obtained by fixing VB.

(8) The Mvid value obtained above is an integer which is equal to or less than 255.

Hereinafter, embodiments of this document will be described in detail.

Figure 5:
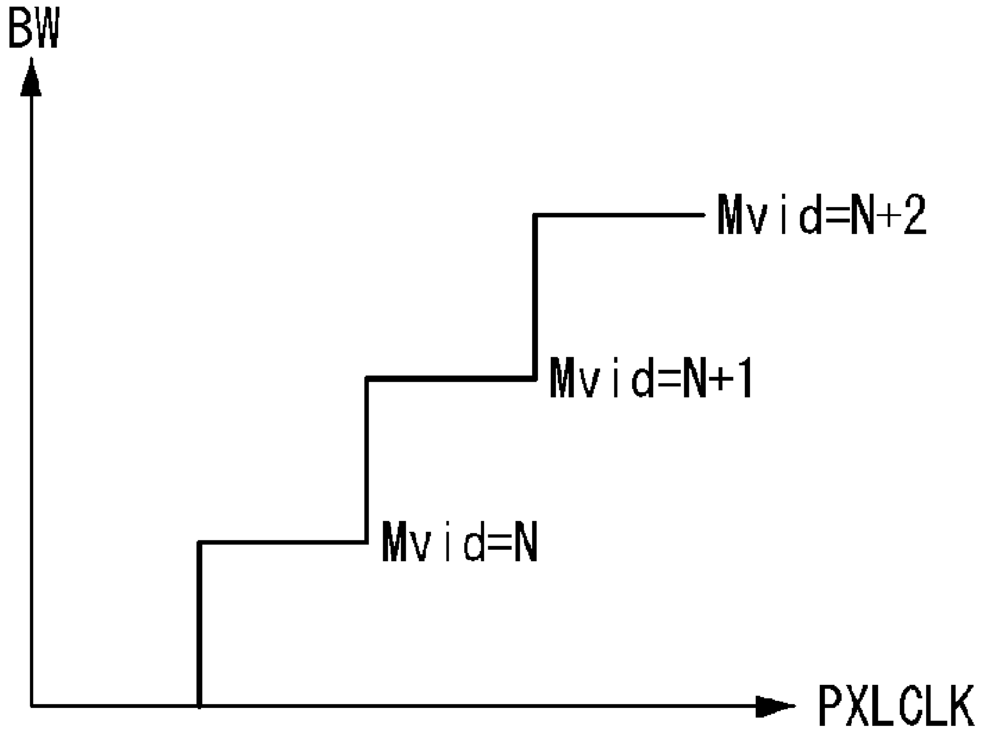
FIG. 5 is a diagram illustrating pixel clocks recovered in the iDP reception circuit.

The M/N PLL 21 of the iDP reception circuit 20 recovers discrete pixel clocks PXLCLK with respect to Mvid as shown in FIG. 5. In an embodiment of this document, variable HB, VB, and Mvid values are obtained using the DRT function, and video data of all color depths currently used is transmitted via the minimum number of lanes at a given resolution by using the values.

Figure 4:
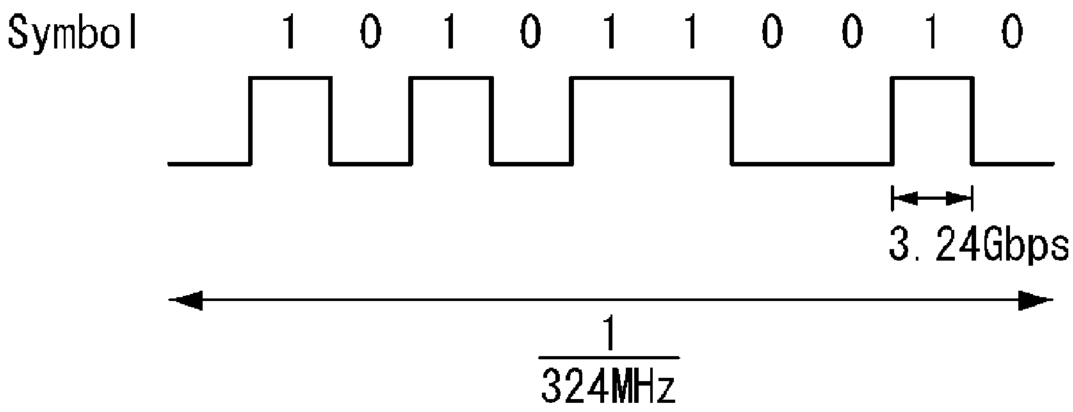
FIG. 4 is a waveform diagram illustrating an example of 3.24 Gbps link symbol clocks transmitted via main link lanes in an iDP interface.

There are no lines for transmitting clocks between the iDP transmission circuit 10 and the iDP reception circuit 20. Therefore, the M/N PLL 21 of the iDP reception circuit 20 recovers the pixel clocks PXLCLK by multiplying the link symbol clocks (hereinafter, simply referred to as "LSCLK" in some cases) of the main link data received via the main link lanes 31 by the multiplication ratio of Mvid/48. The serial bit rate of the link symbol clocks is 3.24 Gbps/lane, and the frequency thereof $f_{LSCLK}$ is 324 MHz/sec as shown in FIG. 4. The Mvid value is an integer between 0 and 255 which can be obtained with 8 bits, and satisfies Equations 3 and 4.

In the example of FHD 120 Hz (HA=1920, VA=1080), when HB is 280 and VA is 45, the frequency of the pixel clocks PXLCLK is 297 MHz and $f_{LSCLK}$ is 324 MHz according to Equation 3. At this time, the Mvid value becomes 44 according to Equation 4, which leads to satisfying all conditions. However, if the resolution is 2560×1080 and the frame refresh rate is 120 Hz, the frequency of the pixel clocks PXLCLK is 384.3 MHz and the Mvid value is 56.8, and thus the iDP interface cannot be used. In this case, in order to satisfy the condition that the Mvid value becomes an integer, the pixel clocks PXLCLK obtained by appropriately adjusting HB and VB using the DRT function is assigned to Equation 3. However, a combination of HB and VB cannot be found until the Mvid value becomes an integer each time the resolution and the frame refresh rate are changed. Therefore, this document proposes a method for systematically finding an optimal combination of HB and VB in the iDP interface.

$$PXCLK = \frac{Mvid}{48} \times LSCLK \tag{3}$$

$$\Rightarrow (HA + HB) \times (VA + VB) \times f = \frac{Mvid}{48} \times LSCLK$$

$$Mvid = \frac{(HA + HB) \times (VA + VB) \times f \times 48}{LSCLK} \tag{4}$$

In Equation 4, the resolution and the reproduction frequency are fixed, and thus HA, VA and f are also fixed. In this method, the link rate is fixed to 3.24 Gbps, LSCLK is also fixed. The frame refresh rates applied to most of NTSC (National Television Standards Committee) display device are 60 Hz, 120 Hz, and 240 Hz. When such frame refresh rates are assigned to Equation 4, Mvid of 60 Hz $Mvid_{60Hz}$, Mvid of 120 Hz $Mvid_{120Hz}$, and Mvid of 240 Hz $Mvid_{240Hz}$ are as follows.

$$Mvid_{60Hz} = \frac{(HA + HB) \times (VA + VB)}{112{,}500}$$

$$Mvid_{120Hz} = \frac{(HA + HB) \times (VA + VB)}{56{,}250}$$

$$Mvid_{60Hz} = \frac{(HA + HB) \times (VA + VB)}{28{,}125}$$

Here, 112500, 56250, and 28125 are results obtained by assigning the frame refresh rate f to LSCLK (=3.24 Gbps)×f×48.

At least one of (HA+HB) and (VA+VB) in the above formulae is required to be a prime factor such that the Mvid value becomes an integer. For example, in the example of the frame refresh rate of 120 Hz, at least one of (HA+HB) and (VA+VB) is required to be a prime factor closest to VA or HA among the prime factors of 56250. If the prime factor is smaller than HA or VA, HB or VB becomes negative blanking time, and if the prime factor is too great, a display device cannot be driven at a corresponding frame refresh rate since HB or VB becomes too great. Considering this, VB and HB are required to satisfy the following Equations 5 and 6.

Figure 6:
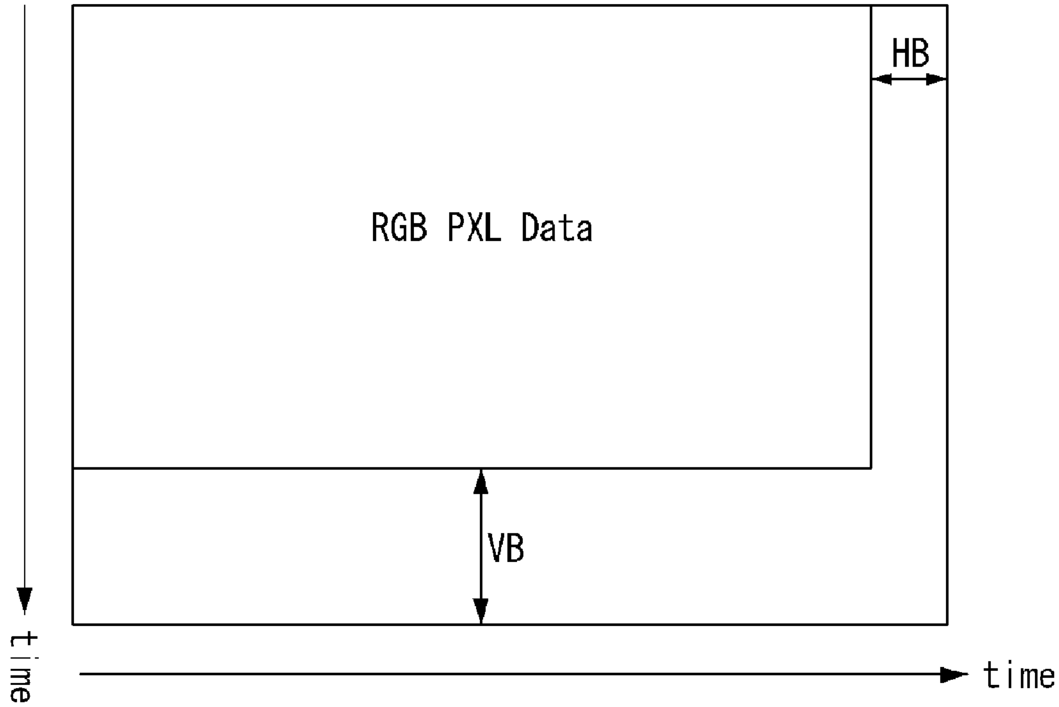
FIG. 6 is illustrating HA, HB, VA, and VB.

FIG. 6 is a diagram illustrating HA, HB, VA, and VB. In FIG. 6, HA and VA indicate active periods which includes video data RGB PXL Data to be displayed on a display device, HB indicates a horizontal blank interval, and VB indicates a vertical blank interval.

$$VB = \text{factor}(x) - VA\ (\text{factor}(x) > VA) \tag{5}$$

$$HB = \text{factor}(x) - HA\ (\text{factor}(x) > HA) \tag{6}$$

In Equations 5 and 6, factor(x) indicates a prime factor which is changed depending on the frame refresh rate.

In a case where the resolution is 2560×1080 and the frame refresh rate is 120 Hz, if (VA+VB) is fixed to a prime factor of 56250, 1125 (refer to FIG. 7) closest to 1080 which is the vertical resolution is selected from the prime factors of 56250 using Equation 5. 45 is obtained as the VB value by subtracting 1080 from 1125. After the VB value obtained in this way is fixed, if a value of giving Mvid an integer is obtained while varying HB by applying the DRT supported by the iDP interface, a result as shown in FIG. 8 can be acquired. In FIG. 8, when a total of HB $HB_{total}$ is 240 and VB is 45, the Mvid value is the integer of 56. In this case, when input images having the resolution of 2560×1080 is transmitted at the frame refresh rate of 120 Hz via the iDP interface, the number of iDP lanes $Lane_{count}$, which supports a channel transmission bandwidth capable of transmitting the images with all of 24 bpp (8 bits for each of R, G, and B), 30 bpp (10 bits for each of R, G, and B), and 36 bpp (12 bits for each of R, G, and B), may be selected as six at the serial link rate 3.24 Gbps of LSCLK. In FIG. 8, #iDP Lane indicates the number of required lanes. If #iDP Lane is 3.50, the number of required lanes in the iDP interface is four, and if #iDP Lane is 4.38, the number of required lanes in the iDP interface is five. In addition, if #iDP Lane is 5.28, the number of required lanes in the iDP interface is six.

In the example of the frame refresh rate of 60 Hz, either (HA+HB) or (VA+VB) is required to be a prime factor closest to VA or HA among the prime factors of 112500 (refer to FIG. 9) with respect to all resolutions. In the example of the frame refresh rate of 240 Hz, either (HA+HB) or (VA+VB) is required to be a prime factor closest to VA or HA among the prime factors of 28125 (refer to FIG. 10) with respect to all resolutions.

In a case of FHD (1920×1080) and f=60 Hz, if (VA+VB) is fixed to a prime factor of 11250, 1250 closest to 1080 which is the vertical resolution is selected from the prime factors of 11250 using Equation 5. In this case, there is a selection of VB=1250−1080=170. After the VB value is fixed to 170 obtained in this way, if a value of giving Mvid an integer is obtained while varying HB by applying DRT, a result as shown in FIG. 11 can be acquired. In FIG. 11, when a total of HB $HB_{total}$ is 2520 and VB is 170, the Mvid value is the integer of 28. In this case, when images having FHD (1920×1080) is transmitted at the frame refresh rate of 60 Hz via the iDP interface, the number of iDP lanes (lane count), which supports channel transmission bandwidth capable of transmitting the images with all of 24 bpp (8 bits for each of R, G, and B), 30 bpp (10 bits for each of R, G, and B), and 36 bpp (12 bits for each of R, G, and B), may be selected as three at the serial link rate 3.24 Gbps of LSCLK.

In a case of FHD (1920×1080) and f=120 Hz, if (VA+VB) is fixed to a prime factor of 56250, 1125 (refer to FIG. 7) closest to 1080 which is the vertical resolution is selected from the prime factors of 56250 using Equation 5. In this case, there is a selection of VB=1125−1080=45. After the VB value obtained in this way is fixed, if a value of giving Mvid an integer is obtained while varying HB by applying DRT, a result as shown in FIG. 12 can be acquired. In FIG. 12, when a total of HB $HB_{total}$ is 2550 and VB is 45, the Mvid value is the integer of 51. HB increases by 50 as Mvid increases by 1. In this case, when images having FHD (1920×1080) is transmitted at the frame refresh rate of 120 Hz via the iDP interface, the number of iDP lanes $Lane_{count}$, which supports a channel transmission bandwidth capable of transmitting the images with all of 24 bpp (8 bits for each of R, G, and B), 30 bpp (10 bits for each of R, G, and B), and 36 bpp (12 bits for each of R, G, and B), may be selected as five at the serial link rate 3.24 Gbps of LSCLK.

In a case of FHD (1920×1080) and f=240 Hz, if (VA+VB) is fixed to a prime factor of 28125, 1125 (refer to FIG. 10) closest to 1080 which is the vertical resolution is selected from the prime factors of 28125 using Equation 5. In this case, there is a selection of VB=1125−1080=45. After the VB value obtained in this way is fixed, if a value of giving Mvid an integer is obtained while varying HB by applying DRT, a result as shown in FIG. 13 can be acquired. In FIG. 13, when a total of HB $HB_{total}$ is 2125 and VB is 45, the Mvid value is the integer of 85. In this case, when images having FHD (1920×1080) is transmitted at the frame refresh rate of 120 Hz via the iDP interface, the number of iDP lanes $Lane_{count}$, which supports a channel transmission bandwidth capable of transmitting the images with all of 24 bpp (8 bits for each of R, G, and B), 30 bpp (10 bits for each of R, G, and B), and 36 bpp (12 bits for each of R, G, and B), may be selected as eight at the serial link rate 3.24 Gbps of LSCLK.

In a case of the resolution of 2560×1080 and f=240 Hz, if (VA+VB) is fixed to a prime factor of 28125, 1125 (refer to FIG. 10) closest to 1080 which is the vertical resolution is selected from the prime factors of 28125 using Equation 5. In this case, there is a selection of VB=1125−1080=45. After the VB value obtained in this way is fixed, if a value of giving Mvid an integer is obtained while varying HB by applying DRT, a result as shown in FIG. 14 can be acquired. In FIG. 14, when a total of HB $HB_{total}$ is 2800 and VB is 45, the Mvid value is the integer of 112. In this case, when images having the resolution of 2560×1080 is transmitted at the frame refresh rate of 240 Hz via the iDP interface, the number of iDP lanes (lane count), which supports channel transmission bandwidth capable of transmitting the images with all of 24 bpp (8 bits for each of R, G, and B), 30 bpp (10 bits for each of R, G, and B), and 36 bpp (12 bits for each of R, G, and B), may be selected as eleven at the serial link rate 3.24 Gbps of LSCLK.

The iDP interface parameters as shown in FIGS. 8, and 11 to 14 may be diversely selected according to designers in consideration of the resolution of input images, the number of lanes, the frame refresh rate, and the like.

Figure 15:
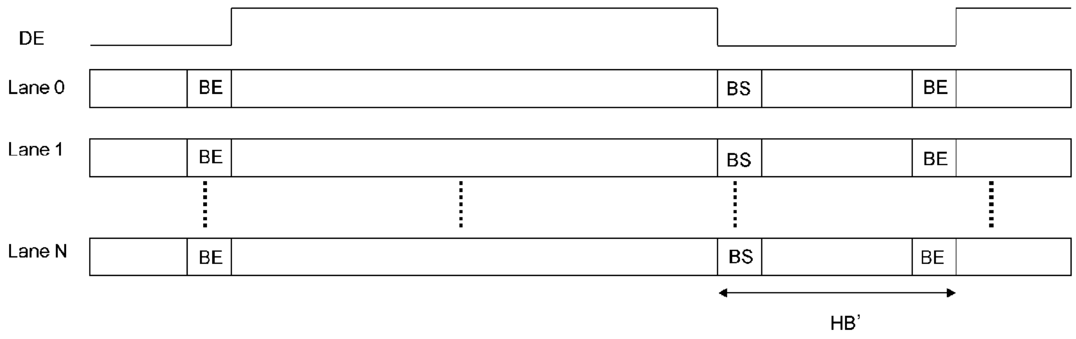
FIG. 15 is a diagram illustrating an HB period which is varied by a DRT function which is supported by the iDP interface standard.

DRT supported by the iDP interface allows HB to be increased or decreased as necessary. Therefore, according to the embodiment of this document, it is possible to increase or decrease a total of HB $HB_{total}$ when VB is fixed, according to a value of giving Mvid an integer, by the use of DRT. FIG. 15 is a diagram illustrating data transmission packets in the iDP interface when N (where N is a positive integer equal to or more than 2) lanes are used. In FIG. 15, "BS" indicates starting of HB, and "BE" indicates ending of HB. HB' indicates HB which can be varied by the DRT function. The total of HB $HB_{total}$ is defined by the number of lanes $Lane_{count}$ and HB' as expressed in Equation 7. "DE" shown in FIG. 15 denotes a data enable signal indicating that video data exists and is generated by the timing controller. The timing controller generates the data enable signal DE based on the pixel clocks PXLCLK recovered by the iDP reception circuit 20.

$$HB_{total}=HB'\times Lane_{count} \tag{7}$$

HB' is an HB value distributed into the respective lanes for transmission and is required to be an integer or a simple decimal. For example, if HB' is 20.5, HB' transmitted from the iDP transmission circuit 10 is transmitted in an order of 21, 20, 21, 20, . . . . This is disclosed in the iDP standard specification, and a maximally variable range of HB' which can be processed by the iDP reception circuit 20 is HB'±2. In FIG. 8, there are many combinations of HB and VB which allow the Mvid value to become an integer and data of all the color depths to be transmitted using six lanes of the iDP interface. However, the number of optimal combinations of Mvid, HB, and VB satisfying the iDP interface standard is three (HB'=40, 65, 90) in FIG. 8.

In a case where VB is fixed and HB is adjusted, since HB values are very diversely calculated, a method is preferable in which an upper limit value of the total of HB $HB_{total}$ is calculated in advance, and HB values which allow the Mvid value to become an integer are obtained according to the value. If Equation 2 used to obtain a channel transmission bandwidth is combined with Equation 3 used to recover pixel clocks in the iDP interface, the maximum total of HB $HB_{total}$ corresponding to the resolution, the color depth, and the frame refresh rate, which are defined at the serial link rate 3.24 Gbps of LSCLK, can be obtained as follows.

The iDP interface uses the ANSI 8B/10B encoding in data transmission, and thus the channel transmission bandwidth $BW_{iDP}$ satisfies Equation 8.

$$BW_{iDP} = \frac{BW}{0.8} \tag{8}$$

First, the number of lanes $Lane_{count}$ and a color depth necessary for the iDP interface are defined. For example, if FHD (1920×1080) and f=120 Hz are to be transmitted at the serial bit rate 3.24 Gbps of LSCLK via six lanes, the total of HB $HB_{total}$ satisfying the maximum channel transmission bandwidth Maximum BW suitable therefor is calculated as follows. The following result corresponds with that shown in FIG. 8. Thus, HB' can be calculated as an integer or a simple decimal under the condition that the total of HB $HB_{total}$ is smaller than 640, and main link data is transmitted via six lanes.

$$3.24\text{ Gbps} = \frac{1}{\text{Lane}_{count}} \frac{(2560 + HB_{total}) \times (1080 + 45) \times 20 \times 36}{0.8}$$

$$\frac{3.24 \times 10^9}{13500} \times 0.8 \times \text{Lane}_{count} = 2560 + HB_{total}$$

$$HB_{total} = 640$$

$$HB' = 106.66$$

According to the regulation set forth in the iDP interface protocol, the iDP transmission circuit 10 is required to transmit vertical blanking ID (hereinafter, referred to as "VB-ID") including image attribute information to the iDP reception circuit 20 for each HB.

Figure 16:
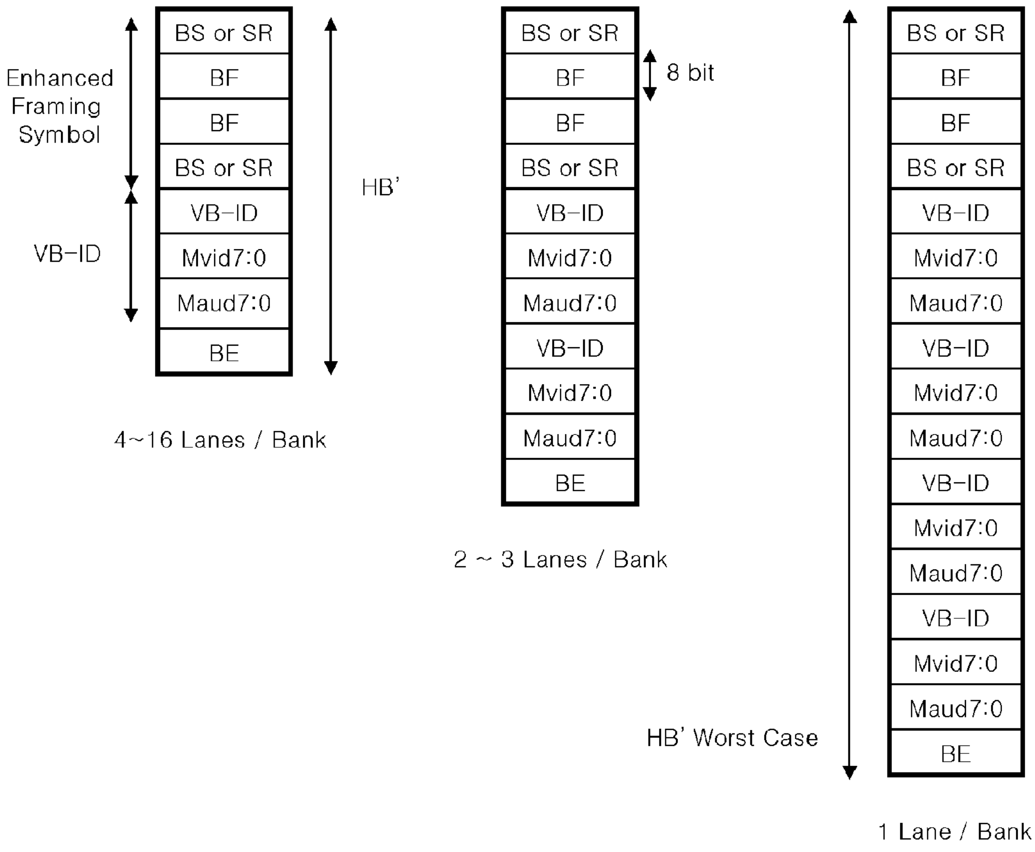
FIG. 16 is a diagram illustrating VB-ID packet configurations which differ from each other depending on the number of lanes.

Referring to FIG. 16, VB-ID packet formats differ from each other depending on the number of lanes. The iDP transmission circuit 10 scrambles 1 and 0 of data so as to make a ratio of the number of ones and zeros equal to the maximum when transmitting data. In order to perform the scrambling, the iDP transmission circuit 10 randomly changes and transmits input symbols for each LSCLK using a 8-bit LFSR (Linear Feedback Shift Register). The iDP transmission circuit 10 recognizes every 512nd BS symbol to be input as an SR (Scrambler Reset) symbol and resets the 8-bit LFSR. The DP interface supports a content protection function. In this function, the SR symbol is called a CPSR (Content Protection SR) symbol, and the CPSR symbol is called a BF symbol in an enhanced framing mode. However, since the iDP interface does not support the content protection function, although the BF symbol is used, it is used in the enhanced framing mode without the content protection. Maud indicates an M value for audio data and is treated as dummy data in a display device.

The VB-ID packet is transmitted from the iDP transmission circuit 10 during the HB'. The VB-ID packet, which is transmitted via 4~16 Lane/Bank, includes eight symbols including the BE symbol, and the VB-ID packet, which is transmitted via 2~3 Lane/Bank, includes eleven symbols including the BE symbol. In addition, the VB-ID packet, which is transmitted via 1 Lane/Bank, includes seventeen symbols including the BE symbol. Therefore, the HB' is required to secure the minimum HB' or more so as to transmit the VB-ID packet. The minimum HB' differs from each other depending on the number of lanes and the color depth, but is required to satisfy the following Equation 9. In the above-described case of the resolution of 2560×1080 and f=120 Hz, if the VB-ID packet is transmitted via six lanes, it is necessary to secure time for transmitting at least eight symbols. If this is assigned to Equation 9, HB' is 80, which is ten times of 8, and thus can sufficiently satisfy the iDP interface protocol.

$$VB\text{-}ID_{symbol} \leq \frac{HB' \times CD}{8} \tag{9}$$

Here, $VB\text{-}ID_{symbol}$ indicates the number of symbols in the VB-ID packet, and CD indicates a color depth. If one pixel includes three sub-pixels, N bpp (bits per pixel) becomes N/3 (pbc).

Figure 17:
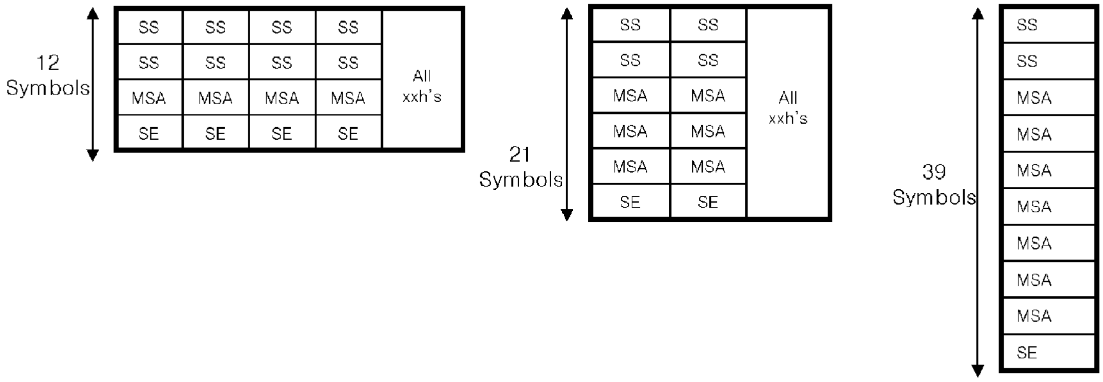
FIG. 17 is a diagram illustrating MSA packet configurations which differ from each other depending on the number of lanes.

In addition, according to the regulation set forth in the iDP interface protocol, an MSA (Main Stream Attribute) packet is required to be transmitted for each VB. Referring to FIG. 17, MSA packet formats differ from each other depending on the number of lanes. In FIG. 17, as a signal indicating starting of MSA packet transmission, SS (Secondary Data Start) is continuously twice transmitted. As a signal indicating ending of the MSA packet, SE (Secondary Data End) is only once transmitted. In addition, xxh's is a signal indicating a dummy symbol (Don't Care), and when this signal is received by the iDP reception circuit 20, the iDP reception circuit 20 disregards a symbol including xxh's.

The MSA packet is transmitted from the iDP transmission circuit 10 during the VB interval. The MSA packet, which is transmitted via 4~16 Lane/Bank, includes thirteen symbols including the BE symbol (not shown), and the MSA packet, which is transmitted via 2~3 Lane/Bank, includes twenty-two symbols including the BE symbol. In addition, the MSA packet, which is transmitted via 1 Lane/Bank, includes forty symbols including the BE symbol. Therefore, the VB time is required to satisfy the following Equation 10 so as to transmit the MSA packet.

$$MSA_{symbol} \leq \frac{VB \times CD}{8} \tag{10}$$

Here, $MSA_{symbol}$ indicates the number of symbols in the MSA packet, and CD indicates a color depth (or the number of bits of data). The unit of the color depth in Equation 10 is bpc.

The unit of the color depth in the equations other than Equations 9 and 10 is bpp.

Figure 18:
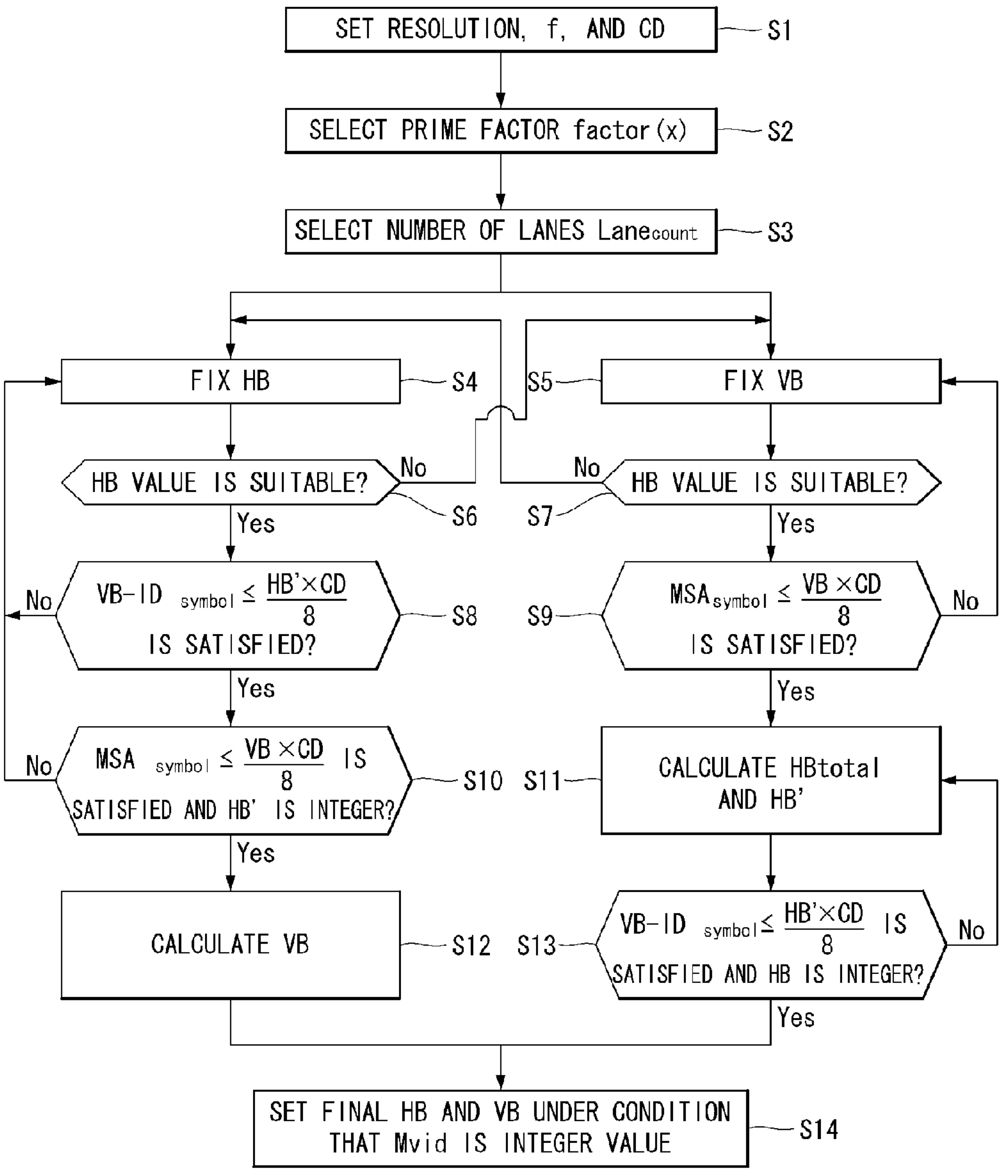
FIG. 18 is a flowchart illustrating a procedure for setting parameters necessary for the method for recovering pixel clocks according to an embodiment of this document.

FIG. 18 is a flowchart illustrating a procedure for setting parameters necessary for a pixel clock recovering method according to an embodiment of this document.

In FIG. 18, first, the resolution of input images, the frame refresh rate f, and the color depth CD are set (S1). Then, a prime factor factor(x) satisfying Equations 5 and 6 is selected, and the number of lanes $Lane_{count}$ is selected (S2 and S3).

Next, an HB value is fixed, and suitability of the HB value is verified with reference to Mvid values (S4 and S6). If the HB value is suitable, it is checked whether or not an HB' value and a VB value satisfy Equations 9 and 10, and a VB value is calculated after it is checked that the HB' value is an integer (S8, S10, and S12). A final HB value and a final VB value satisfying a condition that the Mvid value is an integer are set (S14).

In step S6, if it is determined that the HB value is not suitable, the VB value is fixed after appropriately adjusting the VB value, and suitability of the VB value is verified with reference to Mvid values (S5 and S7). If the VB value is suitable, it is checked whether or not the VB value satisfies Equation 10, maximally allowable total of HB $HB_{total}$ and HB' are calculated, and then it is determined whether or not the HB' value satisfies Equation 9 and the HB' value is an integer (S9, S11, and S13). Next, a final HB value and a final VB value satisfying the condition that an Mvid value is an integer are set (S14).

If it is determined that the VB value is not suitable in step S7, a final HB value and a final VB value are set through steps S4, S6, S8, S10, and S12.

Figure 19:
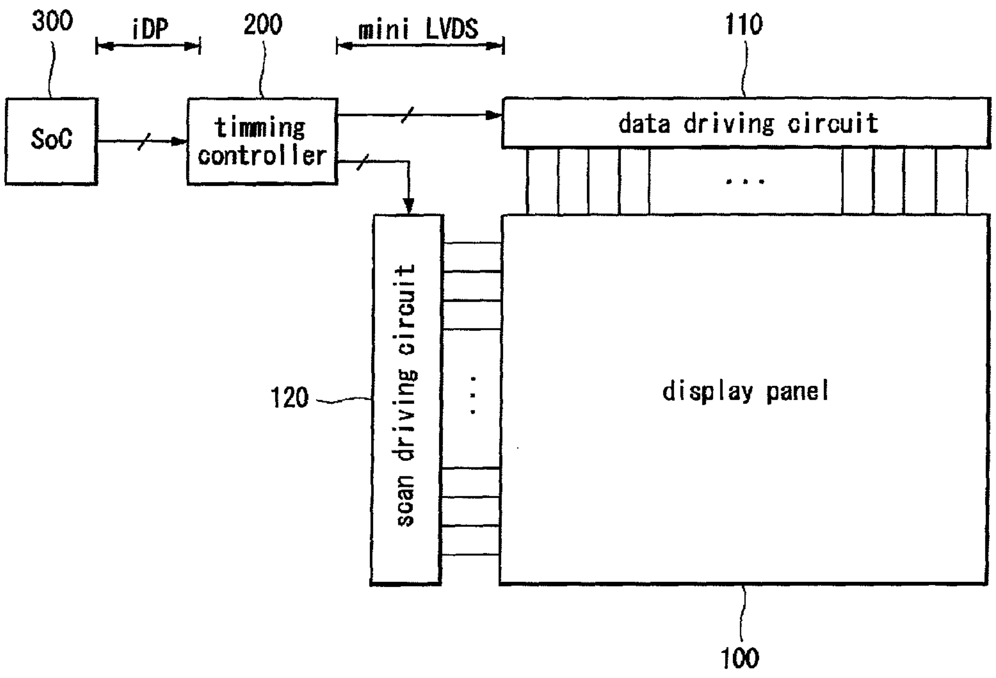
FIG. 19 is a block diagram illustrating a display device according to an embodiment of this document.

FIG. 19 is a block diagram illustrating a display device according to an embodiment of this document.

In FIG. 19, the display device includes a display panel 100, an SoC 300, a timing controller 200, a data driving circuit 110, and a scan driving circuit 120.

The display panel 100 is provided with data lines and scan lines (or gate lines) which intersect each other. The display panel 100 includes pixels formed in a matrix, which are defined by the data lines and the scan lines. Thin film transistors (TFTs) are disposed at the intersections of the data lines and the scan lines. The display panel 100 may be implemented by a display panel of a flat panel display such as a liquid crystal display (LCD), a field emission display (FED), a plasma display panel (PDP), electroluminescence (EL) devices including inorganic or organic light emitting diodes, or an electrophoresis display (EPD). If the display panel 100 is implemented by the display panel of the LCD, a backlight unit is necessary. The backlight unit may be implemented by a direct type backlight unit or an edge type backlight unit.

The SoC 300 transmits main link data including video data information to the timing controller 200 via the above-described iDP interface. The timing controller 200 recovers the pixel clocks PXLCLK by multiplying the link clocks LSCLK of the main link data by the multiplication ratio of Mvid/48, samples the digital video data with the pixel clocks PXLCLK, and transmits the sampled digital video data to the data driving circuit 110. In addition, the timing controller 200 generates timing control signals for controlling operation timings of the data driving circuit 110 and the scan driving circuit 120 based on the pixel clocks PXLCLK. An interface for data transmission between the timing controller 200 and the data driving circuit 110 may be implemented by a mini LVDS interface, but is not limited thereto. For example, the interface between the timing controller 200 and the data driving circuit 110 may employ the interface proposed in U.S. patent application Ser. No. 12/543,996 (Aug. 19, 2009), U.S. patent application Ser. No. 12/461,652 (Aug. 19, 2009), and the like, which have been filed by the present applicant.

The data driving circuit 110 latches the digital video data under the control of the timing controller 200. The data driving circuit 110 converts the digital video data into data voltages which are output to the data lines. The scan driving circuit 120 sequentially supplies scan pulses synchronizing with the data voltages to the scan lines under the control of the timing controller 200.

Figure 20:
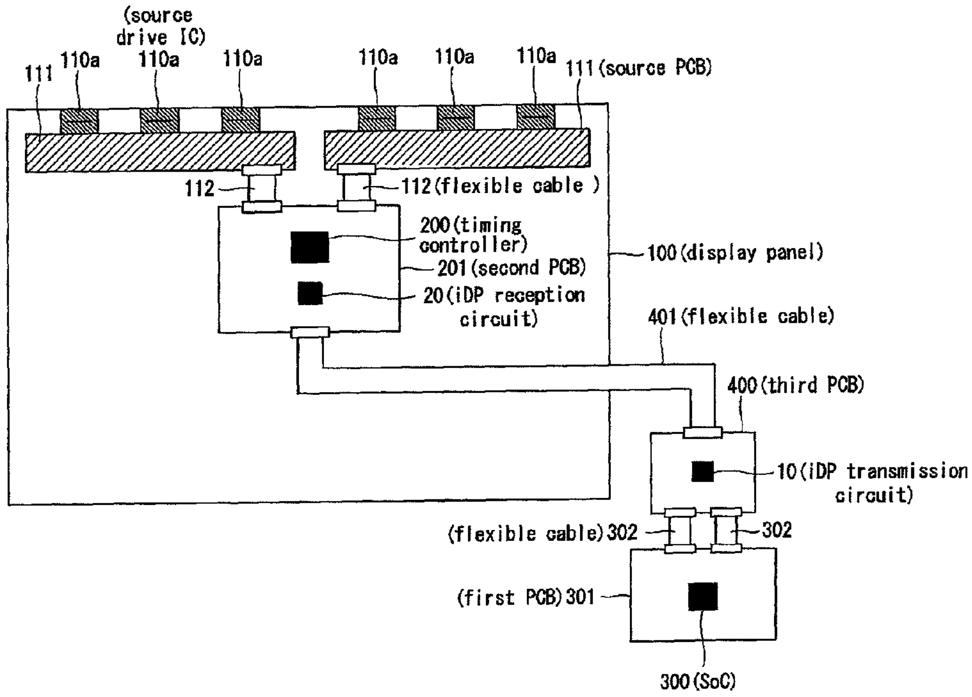
FIG. 20 is a diagram illustrating a circuit configuration example between the SoC and the timing controller shown in FIG. 19.
Figure 21:
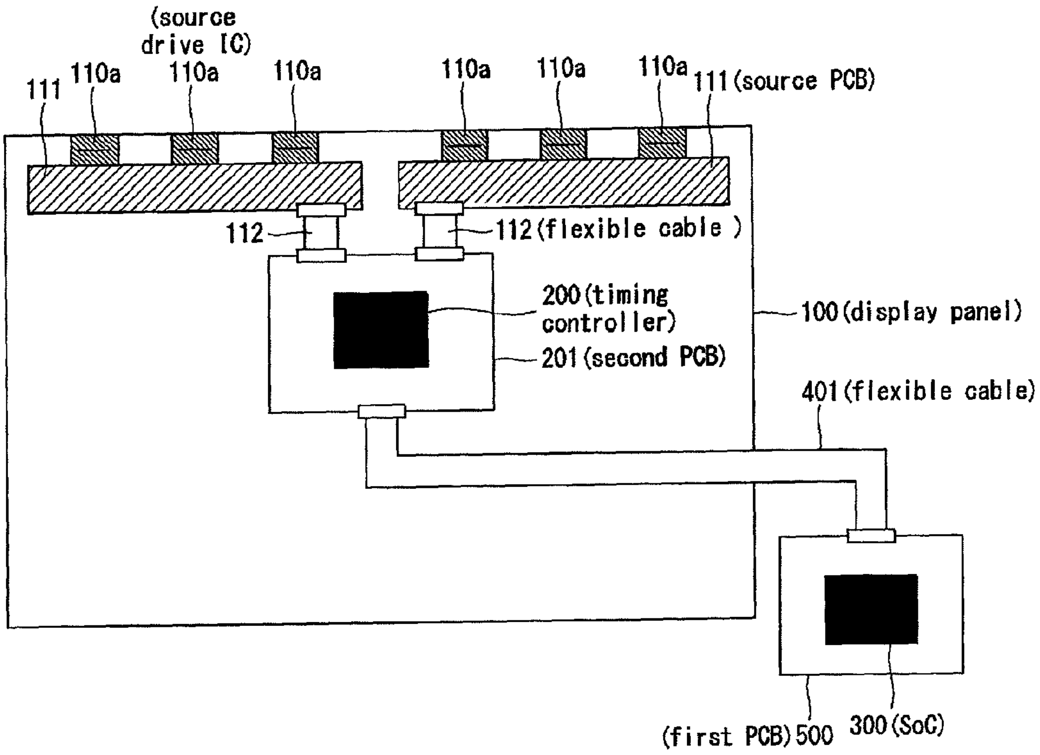
FIG. 21 is a diagram illustrating another circuit configuration example between the SoC and the timing controller shown in FIG. 19.

FIGS. 20 and 21 are diagrams illustrating pixel circuit configurations between the SoC 300 and the timing controller 200.

In FIG. 20, the SoC 300 is mounted on a first PCB 301, and the timing controller 200 and the iDP reception circuit 20 are mounted on a second PCB 201. A third PCB 400 which mounts the iDP transmission circuit 10 thereon is disposed between the first PCB 301 and the second PCB 201. The first PCB 301 is connected to the third PCB 400 via flexible cables 302, for example, FFCs (Flexible Flat Cables) and connectors. Data generated from the SoC 300 on the first PCB 301 may be transmitted to the third PCB 400 via an LVDS transmission circuit. The second PCB 201 is connected to the third PCB 400 via a flexible cable 401 and connectors. The iDP transmission circuit 10 transmits the data from the SoC 300 to the second PCB 201 via the iDP interface, and the iDP reception circuit 20 recovers the pixel clocks PXLCLK so as to be transmitted to the timing controller 200 along with the data.

The second PCB 201 is connected to source PCBs 111 via flexible cables 112. Tape carrier packages (TCPs) which mount source drive ICs 110*a* of the data driving circuit thereon are attached to the source PCBs 111 and the display panel 100.

In FIG. 21, the iDP transmission circuit 10 may be embedded in the SoC 300, and the iDP reception circuit 20 may be embedded in the timing controller 200. The SoC 300 is mounted on a first PCB 500, and the timing controller 200 is mounted on a second PCB 201. The first PCB 500 is connected to the second PCB 201 via the flexible cable 401 and the connectors. Data generated by the SoC 300 on the first PCB 500 is transmitted to the second PCB 201 via the iDP interface.

The iDP reception circuit 20 stores the tables as shown in FIGS. 8, and 12 to 14, and recovers pixel clocks by selecting parameters satisfying the resolution of input images, the frame refresh rate f, and the number of lanes.

As described above, according to this document, parameters such as HB, VB, Mvid, and the like are calculated, and it is possible to systematically and efficiently optimize the parameters for recovering pixel clocks in the iDP interface.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for recovering pixel clocks based on an iDP (Internal Display Port) interface, the method comprising:

selecting a prime factor closest to VA or HA from prime factors (X), and selecting a value obtained by subtracting VA from the selected prime factor, as VB, in $$Mvid = \frac{(HA + HB) \times (VA + VB)}{X},$$

where HA indicates a horizontal active period, HB indicates a horizontal blank interval, VA indicates a vertical active period, and VB indicates a vertical blank interval;

fixing the selected VB value, and selecting a total of HB within one frame period and the number of lanes under a condition that Mvid (M value of M/N PLL) has an integer value; and recovering pixel clocks by multiplying a frequency of link symbol clocks of data received via the lanes by a multiplication of Mvid/48.

2. The method of claim 1, wherein at least one of (HA+HB) and (VA+VB) is a prime factor.

3. The method of claim 1, wherein if the selected prime factor is indicated by factor(x), VB and HB satisfy VB=factor(x)−VA (factor(x)>VA) and HB=factor(x)−HA (factor(x)>HA.

4. The method of claim 1, wherein if HB which can be varied by DRT (Date Rate Throttling) is indicated by HB', the number of the lanes is indicated by Lanecount, and the total of HB is indicated by HBtotal, $HB_{total}$ is given by $HB_{total}$=HB'×$Lane_{count}$.

5. The method of claim 4, further comprising receiving a VB-ID packet during HB, wherein if a number of symbols in the VB-ID packet is indicated by VB-IDsymbol, and a color depth of the received data is indicated by CD, the number of symbols satisfies $$VB\text{-}ID_{symbol} \leq \frac{HB' \times CD}{8}.$$

6. The method of claim 1, further comprising receiving an MSA packet during VB, wherein if a number of symbols in the MSA packet is indicated by MSAsymbol, and a color depth of the received data is indicated by CD, the number of symbols satisfies $$MSA_{symbol} \leq \frac{VB \times CD}{8}.$$

7. A display device comprising:

an iDP (Internal Display Port) transmission circuit;

an iDP reception circuit configured to recover pixel clocks by multiplying a frequency of main link symbol clocks of data sent from the iDP transmission circuit by a multiplication of Mvid (M value of M/N PLL)/48;

N (where N is a positive integer equal to or more than 2) lanes connected between the iDP transmission circuit and the iDP reception circuit;

an SoC (System on Chip) configured to generate the data and transmit the data via the iDP transmission circuit; and a timing controller configured to sample the data received via the iDP reception circuit with the pixel clocks, wherein the iDP reception circuit:

selects a prime factor closest to VA or HA from prime factors (X), selects a value obtained by subtracting VA from the selected prime factor, as VB, and selects a total of HB within one frame period and the number of lanes under a condition that Mvid (M value of M/N PLL) has an integer value in $$Mvid = \frac{(HA + HB) \times (VA + VB)}{X},$$

where HA indicates a horizontal active period, HB indicates a horizontal blank interval, VA indicates a vertical active period, and VB indicates a vertical blank interval, stores VB, the total of HB, information for the number of the lanes, a resolution of the data, and a frame refresh rate, and selects Mvid for recovering the pixel clocks depending on the resolution of the received data, the frame refresh rate, and the number of the lanes.

8. The display device of claim 7, wherein at least one of (HA+HB) and (VA+VB) is a prime factor.

9. The display device of claim 7, wherein if the selected prime factor is indicated by factor(x), VB and HB satisfy VB=factor(x)−VA (factor(x)>VA) and HB=factor(x)−HA (factor(x)>HA).

10. The display device of claim 7, wherein if HB which can be varied by DRT (Date Rate Throttling) is indicated by HB', the number of the lanes is indicated by Lanecount, and the total of HB is indicated by HBtotal, $HB_{total}$ is given by $HB_{total}$=HB'×$Lane_{count}$.

11. The display device of claim 10, wherein the iDP reception circuit receives a VB-ID packet during HB, and wherein if a number of symbols in the VB-ID packet is indicated by VB-IDsymbol, and a color depth of the received data is indicated by CD, the number of symbols satisfies $$VB\text{-}ID_{symbol} \leq \frac{HB' \times CD}{8}.$$

12. The display device of claim 7, wherein the iDP reception circuit receives an MSA packet during VB, and wherein if a number of symbols in the MSA packet is indicated by MSAsymbol, and a color depth of the received data is indicated by CD, the number of symbols satisfies $$MSA_{symbol} \leq \frac{VB \times CD}{8}.$$

13. The display device of claim 7, further comprising:

a display panel configured to display the data;

a data driving circuit configured to supply data voltages to data lines of the display panel under the control of the timing controller; and a scan driving circuit configured to sequentially supply scan pulses to scan lines of the display panel under the control of the timing controller.

14. The display device of claim 13, wherein the display panel is a display pane of any one of a liquid crystal display (LCD), a field emission display (FED), a plasma display panel (PDP), electroluminescence (EL) device, and an electrophoresis display (EPD).

* * * * *